United States Patent
Pedder

Patent Number: 5,604,658
Date of Patent: Feb. 18, 1997

[54] TRIMMABLE CAPACITOR

[75] Inventor: David J. Pedder, Long Compton, Great Britain

[73] Assignee: Plessey Semiconductors Limited, United Kingdom

[21] Appl. No.: 501,630

[22] Filed: Jul. 12, 1995

[30]  Foreign Application Priority Data

Jul. 15, 1994 [GB] United Kingdom ............... 9414362

[51] Int. Cl.$^6$ .................................. H01G 5/011
[52] U.S. Cl. .................... 361/277; 361/271; 361/278
[58] Field of Search ............................ 361/277, 271, 361/313, 321.2, 301, 272, 278; 257/530, 532, 296; 29/25.42

[56]  References Cited

U.S. PATENT DOCUMENTS 4,190,854  2/1980  Redfern.
4,470,096  9/1984  Guertin ................................. 361/277

FOREIGN PATENT DOCUMENTS 2223125  3/1990  United Kingdom.

Primary Examiner—Leo P. Picard
Assistant Examiner—Anthony Dinkins
Attorney, Agent, or Firm—Kirschstein et al.

[57]  ABSTRACT

In a multilayer metallisation/dielectric structure on a silicon substrate a trimmable capacitor is formed between two of the higher metallisation layers, with one layer being segmented and the individual segments connected by way of one or more vias and respective narrow links to one terminal of the capacitor. The narrow links are formed from titanium tungsten on the oxide isolated silicon substrate.

7 Claims, 2 Drawing Sheets

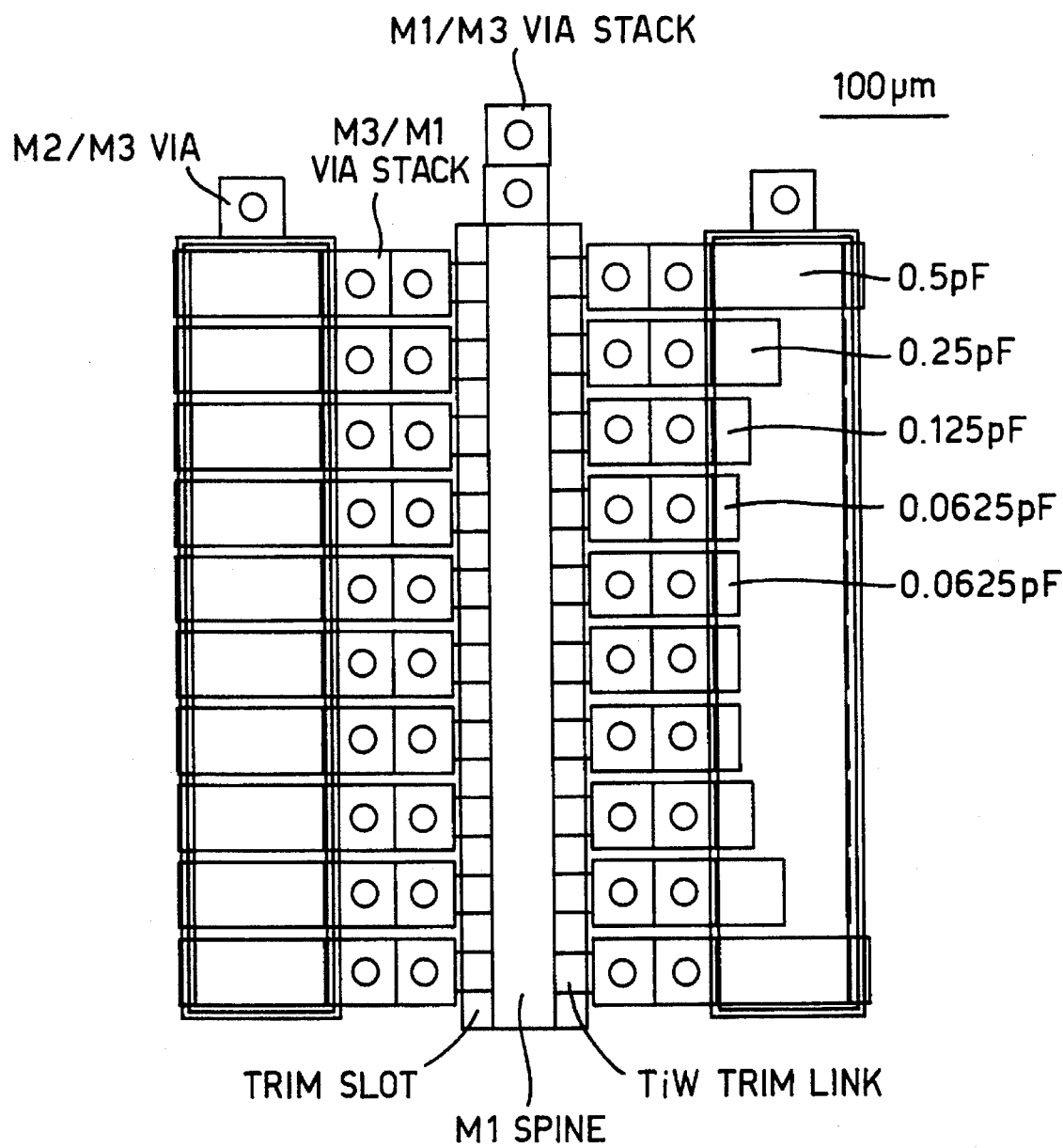

TRIMMABLE CAPACITOR

BACKGROUND OF THE INVENTION

The present invention relates to trimmable capacitors formed in multilayer metallisation/dielectric structures such as those used in multichip modules (MCM).

The multichip module approach to interconnection and packaging employs unpackaged integrated circuit (IC) dice mounted onto a high interconnection-density substrate structure, the resulting assembly being packaged to form a module. The removal of the individual die packaging overhead allows very close die proximity (from 0.4 to 2 mm die spacings being typical) and a high functional density to be achieved. This technology also provides a considerable area and weight saving over the equivalent circuit function realised using individually packaged ICs and surface mount assembly. Typical area savings of between 5 and 10 fold at the substrate level may be achieved. The area fraction of functional silicon in this technology when measured at the substrate level is a function of the assembly method employed. For wire bonded modules this area fraction is typically 30 to 60 percent, while flip chip solder bonded module assemblies can provide area fractions of up to 80 percent. Improvements in reliability are also achieved through the elimination of package leads, solder joints and other materials interfaces in the transition from individual to multichip packaging. Performance improvements are achieved through the elimination of individual device package parasitics and the typically three-fold reduction in inter-device trace lengths.

A number of categories of MCM technology have been defined, describing the type of structure employed to interconnect the naked dice in the MCM assembly. The MCM-L category uses very fine line, multilayer printed circuit board (pcb) substrate structures that are fabricated using extensions of existing pcb manufacturing techniques. Such substrates are suited for interconnect only, all digital modules with low or medium power dissipation and medium wiring density demand (i.e. medium device pin count). They offer the lowest cost per unit area of the MCM substrate alternatives and employ typically up to six metal and dielectric layers. The MCM-C category uses cofired, multilayer ceramic technologies to provide the required interconnection structure. Since the track geometries in this technology are commonly defined by screen printing, which implies limited resolution, the required routing density is achieved by employing additional layers in the multilayer substrate structure. MCM-C modules with up to 40 layers have been reported. The MCM-C substrate structure may be readily incorporated with the module package structure to provide a reliable, cost effective approach to MCM construction for many all-digital, high reliability applications.

The MCM-D substrate category that is of interest in the present application is constructed by thin film deposition technologies (as indicated by the -D qualification) for example with a multilayer aluminium-polyimide metallisation structure (as typical of a silicon MCM substrate), with typically three or four metallisation layers, a ground plane, a power plane and one or two layers for signal trace routing. A five layer construction is also sometimes employed, the fifth metallisation layer being used to place chip connection pads, thus avoiding any constraint on routing in the two signal routing layers below.

The tracks on the silicon substrate are of widths between 10 and 25 micrometers, with metal thicknesses of 2 to 5 micrometers at track pitches of 40 to 100 micrometers, dielectric thicknesses being in the 5 to 20 micrometer range. Such geometries allow controlled impedance, 50 ohm lines to be defined if required. Alternative materials include copper as the conductor material and a range of alternative polymers, including BCB (Benzo cyclo butene) and PPQ (Polyphenyl Quinoxaline). This interconnection geometry allows very high interconnection density to be achieved, while the low parasitics of the interconnection traces and the well defined trace impedances provide high bandwidth. The power and ground plane structures provide high performance power and ground connections locally at each mounted device.

A very important and unique capability of the MCM-D substrate option lies in the ability to integrate the full range of thin film resistor, capacitor and inductor components into the MCM-D substrate structure as required, for example for line termination, decoupling, biassing, matching, filtering and related functions.

SUMMARY OF THE INVENTION

According to the present invention in a multilayer metallisation/dielectric structure on a substrate a capacitor providing a trimmable value of capacitance between a pair of terminals is formed between a first metallisation layer and a second, lower, metallisation layer of said structure with a dielectric layer between said first and second metallisation layers, at least one of said first and second metallisation layers being segmented into a plurality of elements of predetermined areas each connected to a first one of said pair of terminals by way of a respective narrow metallisation link formed in a third metallisation layer lower than said second metallisation layer.

Preferably said metallisation links are connected to respective elements of said one metallisation layer by way of respective via connections through one or more dielectric layers. The dielectric layer may be of silicon nitride. A further layer of silicon nitride may be formed over the capacitor to provide a hermetic seal. Metallisation and/or dielectric layers may be omitted or removed from the area overlying said links. The first metallisation layer may be said segmented layer. The predetermined areas of said elements of said segmented layer may be different to allow different increments of capacitor trimming.

BRIEF DESCRIPTION OF THE DRAWINGS

A trimmable capacitor formed in a multilayer metallisation/dielectric structure in accordance with the present invention will now be described with reference to the accompanying drawings, of which:

FIG. 3 shows diagrammatically a plan view of a trimmable capacitor in accordance with the present invention.

DETAILED DESCRIPTION OF THE PREFERRED EMBODIMENTS

Figure 1:
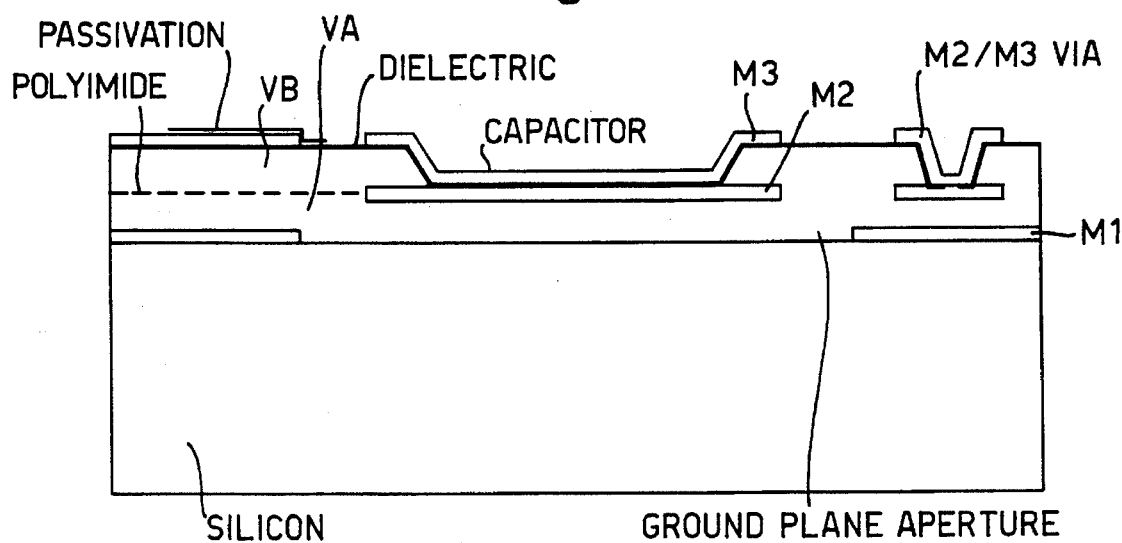
FIG. 1 shows diagrammatically a sectional view of a non-trimmable capacitor.

Referring first to FIG. 1 the processing and patterning of metallisation layer M1, polyimide layer VA, and metallisation layer M2 are conducted using conventional MCM-D processes to build up the structure on an oxide isolated silicon, or sapphire or alumina substrate base. The processes employed may include sputter deposition and wet or dry etching for the aluminium metallisation, with spin or spray coating, curing and wet or dry etching for the polyimide layers. The VB polyimide layer is then applied and cured over the M2 metal layer. Small apertures are then defined in this VB layer where intermetal layer (M2M3) via locations are required (25 micrometers diameter typical), and larger apertures are defined where M2 to M3 capacitor structures are required (50 micrometers to 1 mm typical dimensions).

A silicon nitride layer is then deposited, typically by a conformal, plasma enhanced chemical vapour deposition process from a silane, ammonia and nitrogen gas mixture at a temperature of over 300° C. This temperature is preferably below that at which the polyimide has been cured. The film thickness is preferably between 0.2 and 1.0 micrometers, although other thicknesses may be employed as required for particular applications and material combinations. The deposition conditions are suitably adjusted to control the level of compressive stress in this film, a preferred stress level being $\geq 3 \times 10^8$ for a 0.5 to 1.0 micrometer film. This nitride layer functions as a stiffening layer (to facilitate subsequent wire bonding to M3 pads) and as the dielectric layer for the capacitor structures.

Apertures are then defined in this nitride layer (typically by plasma dry etching using established processes) only where M2M3 vias are required. These apertures are preferably of dimensions smaller than that of the via base aperture in the VB layer. The M3 metal layer is then deposited and patterned, the M3 features extending over the side walls of the M2M3 vias and capacitor areas.

The structure is completed by the deposition and patterning of a second nitride layer. Apertures are defined in this second layer, which serves as a protection and passivation layer of the structure, where wire bond connections are to be made, or where solderable metallisations and solder bumps are to be defined. This second layer is preferably between 0.2 and 1.0 micrometers in thickness. This second layer provides a second level of passivation for the underlying polyimide and metal layers, minimising the probability of coincident pinhole defects being found that expose the polyimide layers to moisture. The use of elevated deposition temperatures for the nitride deposition ensures that the polyimide is entirely moisture free at the time of nitride deposition. The via patterning structure ensures that M2M3 via sidewalls are sealed to prevent moisture ingress during processing.

The capacitor structure described can provide a capacitance of about 100 pF per square mm for a 0.7 micrometer film thickness, a useful value for RF and microwave applications. Such a film thickness also provides a sufficient stiffening effect for high yield wire bonding and a reliable passivation seal for the polyimide. The use of full thickness M2 and M3 electrode layers (resistance of 5 to 10 milliohms per square typical) for such a capacitor ensures low equivalent series resistance and high quality factor for good high frequency performance. Where high performance through capacitors are required, the M1 ground plane is locally removed beneath the capacitor. The location of the capacitor structure, separated as it is from the underlying silicon substrate by the VA polyimide layer, then ensures minimal stray capacitance to ground to further enhance the high frequency performance.

Figure 2:
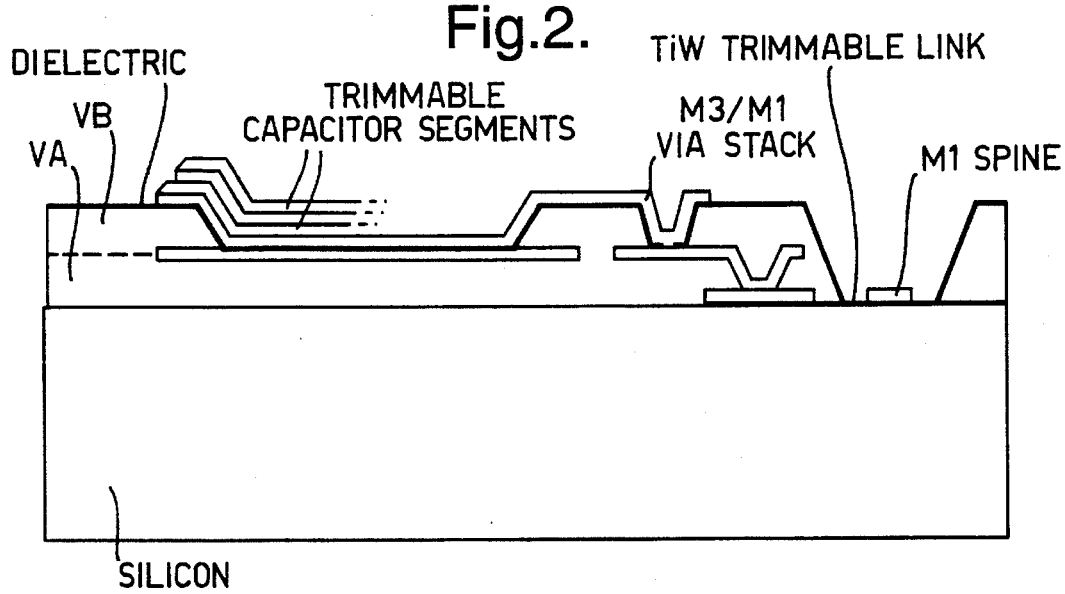
FIG. 2 shows diagrammatically a sectional view of a trimmable capacitor in accordance with the present invention.

Referring now to FIGS. 2 and 3, the processing sequence is similar to that employed for the capacitor structure of FIG. 1, but the pattern structure is modified to provide a segmented M3 upper electrode structure with each segment connected, by means of an M3M2 to M2M1 via stack, to a short titanium-tungsten (TiW) trace located on the oxide isolated silicon substrate layer. The TiW trace for each segment is in turn connected to a central spine trace of M1 aluminium metallisation. This M1 trace provides a common connection for all the capacitor segments that are defined by the segmented M3 electrode and the common M2 lower electrode layer. The TiW traces are typically 0.1 to 0.2 micrometers in thickness and are exposed for laser trimming by local removal of the overlying polyimide layers (conducted in the normal polyimide patterning sequence that defines the interlayer vias and capacitor apertures). The nitride layers may be left in place to provide some local hermetic sealing prior to laser trimming. Laser trimming of a given TiW trace then removes the associated capacitor segment from the overall capacitor, thus reducing the total capacitance value. The TiW material is selected as the laser trimmable link since it has a relatively high optical absorption for good coupling of the laser energy, and is of acceptable thermal mass.

The areas of the segmented M3 electrode that define the individual elements of the trimmable capacitor may be of varied area to provide various degrees of resolution in the laser trimming process as trimming proceeds. Such a variable area structure is illustrated in the plan view of FIG. 3. In this case a capacitor design for a total capacitance of 7 pF is shown in which a trim accuracy of 0.8% may be achieved with just 20 capacitor segments. The initial trimming stages may be employed to calibrate the rate of change of the function being trimmed (for example an oscillator frequency) as a function of the size of the trim step. The approach to the final trim value may then be predicted and controlled to the required accuracy. Such a calibration procedure allows an area-efficient trimmable capacitor design to be employed.

I claim:

1. A multi-layer metallization/dielectric structure on a substrate, and forming a capacitor providing a trimmable value of capacitance, said structure comprising:

a first metallization layer formed on said substrate;

a first dielectric layer formed over at least part of said first metallization layer;

a second metallization layer formed over said first dielectric layer;

a second dielectric layer formed over said second metallization layer;

a third metallization layer formed over said second dielectric layer;

at least one of said second and third metallization layers being formed as a first plurality of separate segments of predetermined areas;

said first metallization layer being formed as a second plurality of narrow metallization links equal in number to said first plurality and extending from a common connection; and means, including respective via connections through at least said first dielectric layer, for connecting each of said separate segments to a respective one of said links.

2. The structure in accordance with claim 1, wherein said second dielectric layer is of silicon nitride.

3. The structure in accordance with claim 1, wherein said first metallization layer is of titanium tungsten.

4. The structure in accordance with claim 1, wherein a layer of silicon nitride is formed over said third metallization layer.

5. The structure in accordance with claim 1, wherein said first dielectric layer is not formed over said narrow links of said first metallization layer.

6. The structure in accordance with claim 1, wherein said third metallization layer is fonned as said plurality of separate segments.

7. The structure in accordance with claim 1, wherein said segments are of a plurality of different areas to allow for different increments of capacitor trimming.

* * * * *